United States Patent
Sudo

(10) Patent No.: US 6,320,455 B1
(45) Date of Patent: Nov. 20, 2001

(54) BOOST CIRCUIT

(75) Inventor: Naoaki Sudo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/533,176

(22) Filed: Mar. 22, 2000

(30) Foreign Application Priority Data

Mar. 23, 1999 (JP) .................................. 11-078729

(51) Int. Cl.$^7$ .............................. G05F 1/10; G05F 3/02
(52) U.S. Cl. ................ 327/536; 356/189.09; 356/189.11
(58) Field of Search .................................. 327/535, 536, 327/537, 538, 545, 589; 365/189.09, 189.11

(56) References Cited

U.S. PATENT DOCUMENTS 6,141,262 * 10/2000 Sudo ............................... 365/189.09

FOREIGN PATENT DOCUMENTS

| 4-313889 | 11/1992 | (JP) . |
| 7-326194 | 12/1995 | (JP) . |
| 9-172371 | 6/1997 | (JP) . |
| 9-265794 | 10/1997 | (JP) . |
| 10-050088 | * 2/1998 | (JP) . |
| 10-104282 | 4/1998 | (JP) . |

* cited by examiner

Primary Examiner—Terry D. Cunningham
Assistant Examiner—Quani Tra
(74) Attorney, Agent, or Firm—Young & Thompson

(57) ABSTRACT

Boost circuit units are connected in parallel. A boost output voltage $V_{BOOST}'$ of a dummy boost circuit unit having the same configuration as the boost circuit units is detected by a voltage detection circuit. The voltage detection circuit outputs a signal TBST2 which becomes "high" when $V_{BOOST}'$ is lower than $V_{LIMIT}$ and "low" when $V_{BOOST}'$ is equal to or higher than $V_{LIMIT}$. The TBST2 signal is input to a NAND circuit. When a "high" signal is input to the NAND circuit, an input voltage ATDBST2 is input to the boost circuit unit as well via the NAND circuit and the two boost circuit units perform boost operation. Thus, a boost circuit can suppress the dispersion of the boost voltage caused by the dispersion of the process condition and the variation of the external temperature besides the variation of the power supply voltage Vcc.

5 Claims, 6 Drawing Sheets

BOOST CIRCUIT

BACKGROUND OF THE INVENTION

1. Field of the Invention

The present invention relates to a boost circuit of a semiconductor integrated circuit, and in particular to a boost circuit capable of outputting a boost voltage decreased in dispersion by simulatively detecting outputs of boost circuit units and controlling the number of circuit units to be activated among a plurality of boost circuit units connected in parallel.

2. Description of the Related Art

Recently in a semiconductor memory device such as a flash memory, reduction of the current consumption of a whole memory chip is demanded as the power supply voltage required to actuate the semiconductor memory device is lowered. Therefore, a voltage which is needed within the memory and which is higher than the power supply voltage needs to be generated by raising the power supply voltage to a desired high voltage within the chip. For such a purpose, a boost circuit is used.

FIG. 1 is a block diagram showing a conventional boost circuit. In this boost circuit, a boost input voltage $B_{BOOST}$ is inverted by an inverter 40. The inverted voltage is input to a transistor 41, and output as an amplified voltage $V_{BOOST}$ via capacitance 42. The transistor 41 is controlled at its gate by a level shifter (L/S) 43. On the basis of the input voltage $B_{BOOST}$ and the output voltage $V_{BOOST}$, the L/S 43 controls the gate voltage of the transistor 41.

However, this conventional boost circuit has a problem that the output voltage is largely varied due to variations in the power supply voltage and external temperature and dispersions in process factors of the chip.

Heretofore, therefore, as shown FIG. 2, there has been proposed such a boost circuit that the boost circuit shown in FIG. 1 is used as each of boost circuit units 32 and 33 and the boost circuit units 32 and 33, are connected in parallel between an input terminal 31 and an output terminal 38.

In this conventional boost circuit, the input terminal 31 is input with a boost input voltage ATDBST2. Between the input terminal 31 and the boost circuit unit 32, an inverter 34 is connected. Between the input terminal 31 and the boost circuit unit 33, a NAND circuit 35 is connected. A power supply voltage detection circuit 37 is connected to the other input terminal of the NAND circuit 35. As a result, the boost input voltage ATDBST2 and an output signal of the power supply voltage detection circuit 37 are input to the NAND circuit 35. A logical product of them is input to the boost circuit unit 33. The power supply voltage detection circuit 37 outputs a "high" signal when a power supply voltage Vcc is lower than a predetermined voltage $V_{LIMIT}$, and outputs a "low" signal when the power supply voltage Vcc is equal to or higher than $V_{LIMIT}$.

Furthermore, between the output terminal 38 and a ground terminal, a capacitor 36 having capacitance $C_L$ is connected. And an amplified voltage $V_{BOOST}$ is output from the output terminal 38.

Operation of this conventional boost circuit will now be described. The power supply voltage detection circuit 37 outputs a "high" signal when a power supply voltage Vcc is lower than a predetermined voltage $V_{LIMIT}$. Via the NAND circuit 35, the boost input voltage ATDBST2 is input to the boost circuit unit 33 as well. The boost circuit unit 33 is thus activated. In this case, the boost circuit operates by using two circuit units, i.e., the boost circuit unit 32 and the boost circuit unit 33.

The power supply voltage detection circuit 37 outputs a "low" signal when the power supply voltage Vcc is equal to or higher than a predetermined voltage $V_{LIMIT}$. The boost input voltage ADBST2 is not input to the boost circuit unit 33. Accordingly, the boost circuit unit 33 ceases its operation. In this case, the boost circuit operates with one boost circuit unit, i.e., the boost circuit unit 32.

By controlling the number of activated boost circuit units to be activated according to the variation of the power supply voltage, therefore, the variation of the output of the boost circuit can be suppressed.

In the above-described conventional boost circuit, however, only the variation of the power supply voltage is detected. Although it is possible to prevent the variation of the boost circuit output caused by the variation of the power supply voltage, therefore, there has been a problem that variation of the boost voltage itself caused by dispersion of the process condition and the variation of the external temperature cannot be suppressed.

SUMMARY OF THE INVENTION

An object of the present invention is to provide a boost circuit capable of suppressing the dispersion of the boost voltage caused by the dispersion of the process condition and the variation of the external temperature besides the variation of the power supply voltage Vcc.

According to the present invention, a boost circuit comprises: a main part of the boost circuit including a plurality of (n) boost circuit units connected in parallel; a boost voltage detection section including a dummy boost circuit unit having the same configuration as the boost circuit units of the main part of the boost circuit, and a voltage detection circuit for detecting an output voltage of the dummy boost circuit unit; and a selection circuit for selecting the number of boost circuit units to be activated in the main part of the boost circuit, based on a result of detection of the boost voltage detection section.

The voltage detection circuit may be adapted to compare the output voltage of the dummy boost circuit unit with a specific voltage $V_{LIMIT}$ and output a "high" or "low" test signal.

Furthermore, the min part of the boost circuit may be adapted to include an input terminal for inputting a signal to the boost circuit units connected in parallel; and an output terminal for outputting a signal supplied from the boost circuit units connected in parallel, and the selection circuit may be adapted to include an inverter connected between the input terminal and a first boost circuit unit; (n−1) NAND circuits respectively connected between the input terminal and second to nth boost circuit units; and a circuit for inputting the test signal to the NAND circuits.

In this case, the boost circuit may have such a configuration that the main part of the boost circuit has two boost circuit units connected in parallel, and the specific voltage $V_{LIMIT}$ is one in number.

Or the boost circuit may have such a configuration that the main part of the boost circuit has m (where m is a natural number of at least 3) boost circuit units connected in parallel, (m−1) values of the voltage $V_{LIMIT}$ are set, and (m−1) test signals depending on the (m−1) values of the specific voltage $V_{LIMIT}$ are input to (m−1) boost circuit units, respectively.

In the present invention, a dummy boost circuit unit having the same configuration as the boost circuit units of the main part of the boost circuit is provided and the number of activated boost circuit units of the boost circuit is controlled by detecting the boost voltage of the dummy boost circuit unit. Accordingly, the boost voltage output from the main part of the boost circuit can be controlled so as to be within a fixed narrow width. As a result, it is possible to absorb not only the variation of the power supply voltage but also the dispersion of the process condition and the variation of the external temperature. The dispersion of the boost voltage can thus be suppressed. In addition, it is possible to reduce wasteful current consumption by limiting the number of activated boost circuit units when the boost output is high.

DESCRIPTION OF THE PREFERRED EMBODIMENTS

Figure 3:
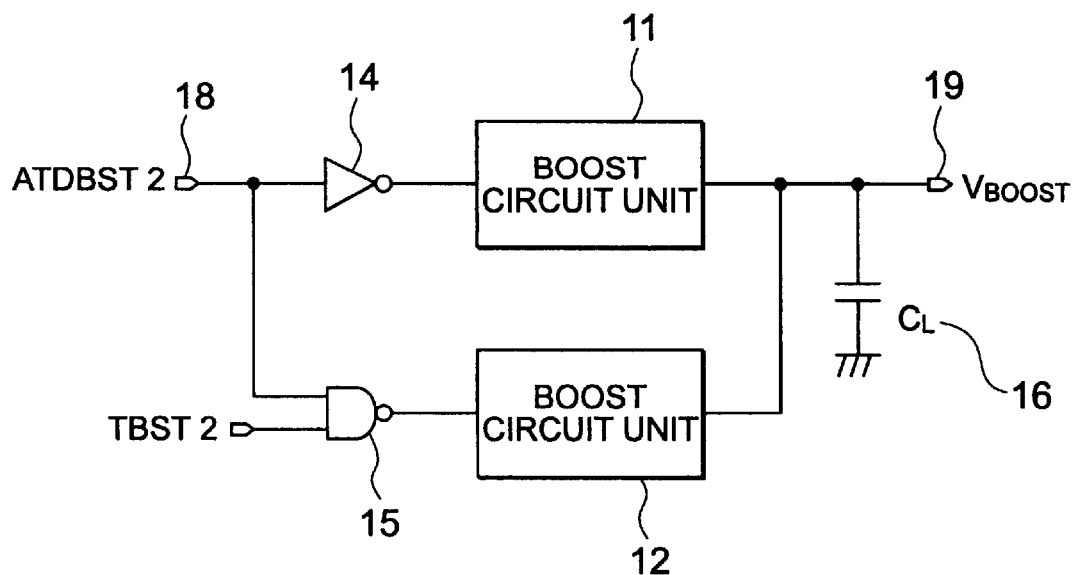
FIG. 3 is a block diagram showing a boost circuit main body in a first embodiment of the present invention.
Figure 4:
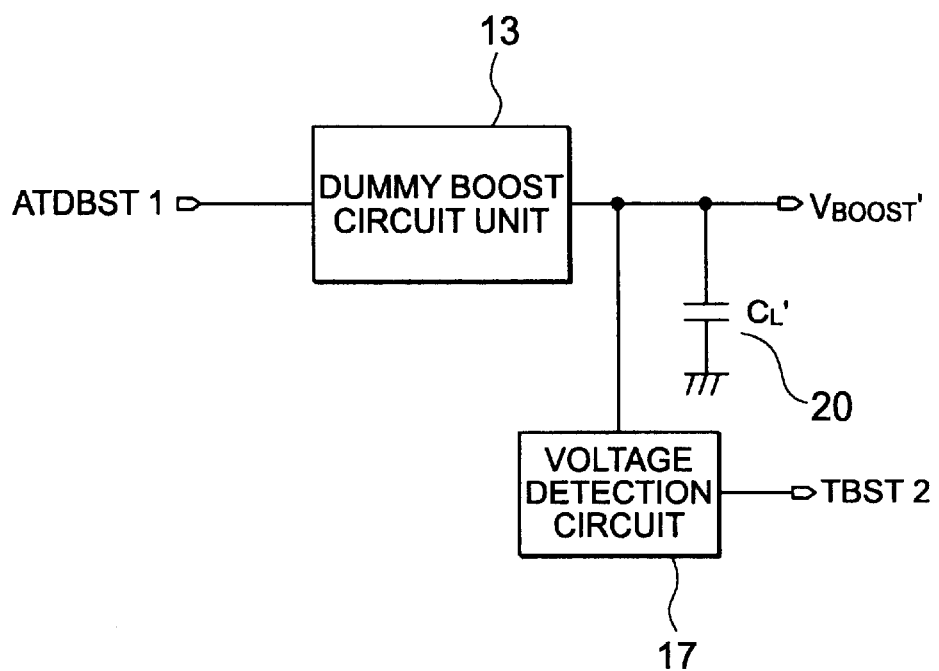
FIG. 4 is a block diagram showing a boost voltage detection unit in the first embodiment of the present invention.

Hereafter, boost circuits according to embodiments of the present invention will be described. FIG. 3 is a block diagram showing a main part of a boost circuit according to a first embodiment of the present invention. FIG. 4 is a block diagram showing a boost voltage detection unit in this boost circuit.

In the boost circuit as shown in FIG. 3, a boost circuit unit 11 and a boost circuit unit 12 are connected in parallel between an input terminal 18 input with a boost input voltage ATDBS2 and an output terminal 19 for outputting a boost voltage therefrom. Between the input terminal 18 and the boost circuit unit 11, an inverter 14 is connected. Between the input terminal 18 and the boost circuit unit 12, a NAND circuit 15 is connected. The boost input voltage ATDBST2 is input to one of input terminals of the NAND circuit 15. An output signal TBST2 of a voltage detection circuit 17 described later is input to the other of the input terminals of the NAND circuit 15. Furthermore, between the output terminal 19 and the ground, a capacitor 16 having load capacitance ($C_L$) is connected.

On the other hand, in a boost voltage detection unit, a dummy boost circuit unit 13 having the same configuration as the boost circuit units 11 and 12 is provided as shown in FIG. 4. The boost input voltage ATDBST1 is input to the dummy boost circuit unit 13. The dummy boost circuit unit 13 outputs a dummy boost output voltage $V_{BOOST}'$.

Figure 1:
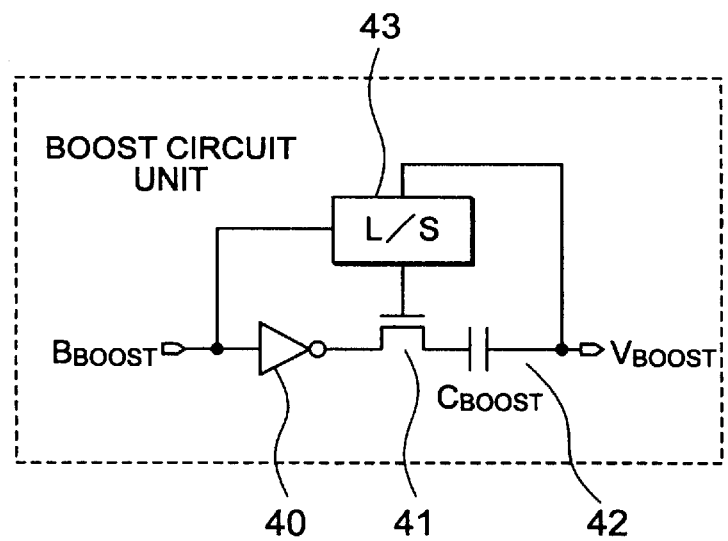
FIG. 1 is a circuit diagram showing a conventional boost circuit.
Figure 2:
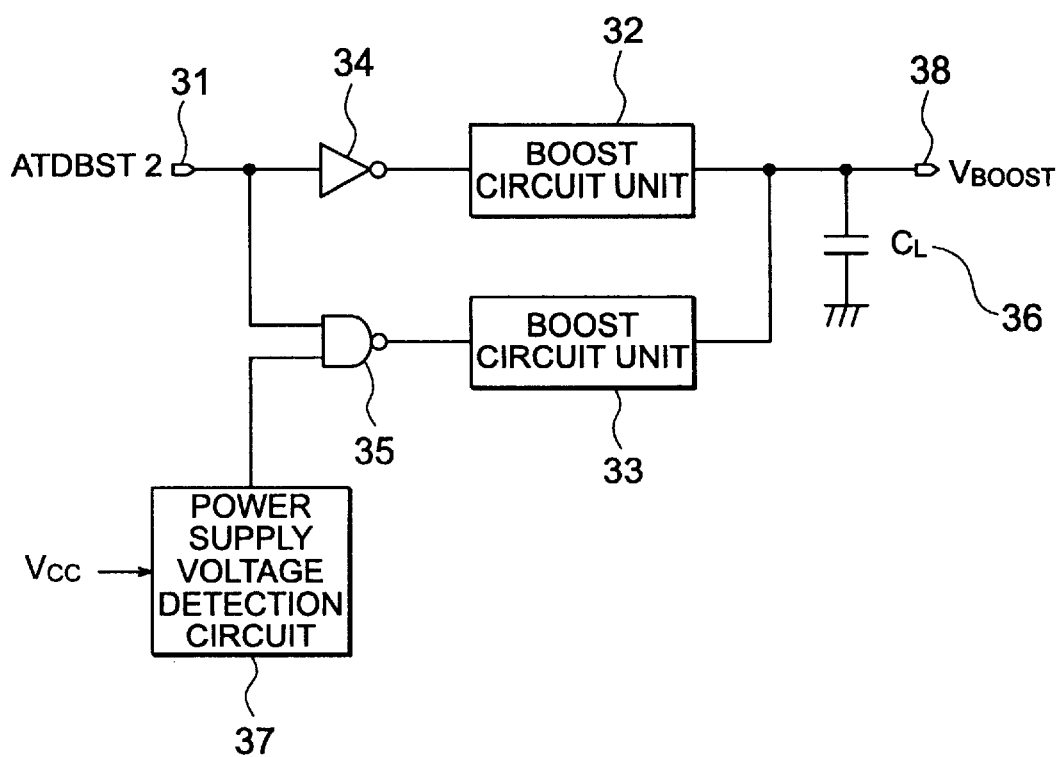
FIG. 2 is a block diagram showing an another conventional boost circuit.

The output voltage $V_{BOOST}'$ of the dummy boost circuit unit 13 is input to a voltage detection circuit 17. The voltage detection circuit 17 outputs an output signal TBST2. The output signal TBST2 becomes "low" when the detected dummy boost output voltage $V_{BOOST}'$ is equal to or higher than a specific voltage $V_{LIMIT}$. The output signal TBST2 becomes "high" when the detected dummy boost output voltage $V_{BOOST}'$ is lower than the specific voltage $V_{LIMIT}$. Between an output terminal of the dummy boost circuit unit 13 and the ground, a capacitor 20 having load capacitance ($C_L'$) is connected. By the way, the configuration of the boost circuit units 11 and 12, and the dummy boost circuit unit 13 are basically the same as the configuration of the conventional boost circuit units 32 and 33 shown in FIG. 1.

Operation of the boost circuit according to the first embodiment having the above-described configuration will now be described.

Figure 5:
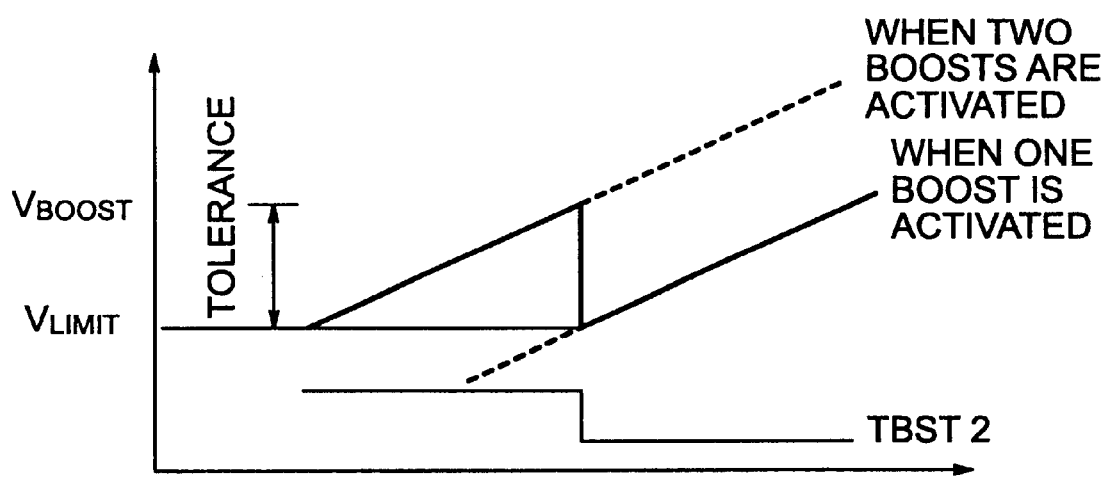
FIG. 5 is a graphic diagram showing relations between variation factors of two boost circuit units, such as power supply voltage and external temperature, and boost output voltage in the first embodiment of the present invention.

FIG. 5 shows variation factors, such as the power supply voltage Vcc, threshold voltage Vth, thickness Tox of an oxide film, and process temperature, in its abscissa. FIG. 5 shows the variation of the output voltage $V_{BOOST}$ of the boost circuit units 11 and 12 in its ordinate. Thus FIG. 5 shows relations between them. The output voltage $V_{BOOST}$ rises, as the power supply voltage Vcc becomes higher, as the threshold voltage Vth becomes lower, as the oxide film thickness Tox becomes thinner, and as the temperature becomes lower. The dummy boost circuit 13 has a similar characteristic because it has a similar configuration. Therefore, the output voltage $V_{BOOST}'$ of the dummy boost circuit 13 also changes in the same way as a straight line "when one BOOST is activated" shown in FIG. 5.

In the voltage detection circuit 17, a lower limit value of a tolerance of the $V_{BOOST}$ is set as $V_{LIMIT}$. The voltage detection circuit 17 outputs a signal TBST2. When the output $V_{BOOST}'$ of the dummy boost circuit unit 13 is equal to or higher than $V_{LIMIT}$, the signal TBST2 becomes "low." When the output $V_{BOOST}'$ is lower than $V_{LIMIT}$, the signal TBST2 becomes "high." The output of the voltage detection circuit 17 is thus set. When the boost input voltage ADBST1 is input to the dummy boost circuit unit 13 and the dummy boost voltage $V_{BOOST}'$ is output, the voltage detection circuit 17 detects the dummy boost voltage $V_{BOOST}'$. If $V_{BOOST}'$ is equal to or higher than the predetermined voltage $V_{LIMIT}$, then the voltage detection circuit 17 outputs the signal TBST2 which is in the "low" state.

The NAND circuit 15 obtains a logical product of the signal TBST2 which is in the "low" state and the boost input voltage ATDBST2. Since one input is "low," the input voltage ATDBST2 is not input to the boost circuit unit 12 and consequently the boost circuit unit 12 does not perform the boost operation. In other words, only one boost circuit unit 11 is activated.

If the dummy boost voltage $V_{BOOST}'$ is less than the predetermined voltage $V_{LIMIT}$, the voltage detection circuit 17 outputs the signal TBST2 which is in the "high" state. Thereupon, the NAND circuit 15 obtains a logical product of the boost input voltage ATDBST2 and the signal TBST2 which is in the "high" state. Accordingly, the boost input voltage ATDBST2 is input to the boost circuit unit 12. As a result, the boost circuit unit 12 performs the boost operation. Thus, both the boost circuit unit 11 and the boost circuit unit 12 perform the boost operation. With respect to variations of the power supply voltage and the external temperature, therefore, the boost output voltage $V_{BOOST}$ varies as represented by a solid line "when two BOOSTs are activated" shown in FIG. 5. With respect to variations of the power supply voltage, process condition, and temperature or the like, therefore, the boost circuit of the present embodiment outputs the output voltage $V_{BOOST}$ having a pattern represented by a solid line of FIG. 5. The output voltage $V_{BOOST}$ varies in the tolerance. As a result, the dispersion of the boost output voltage $V_{BOOST}$ can be suppressed.

Figure 6:
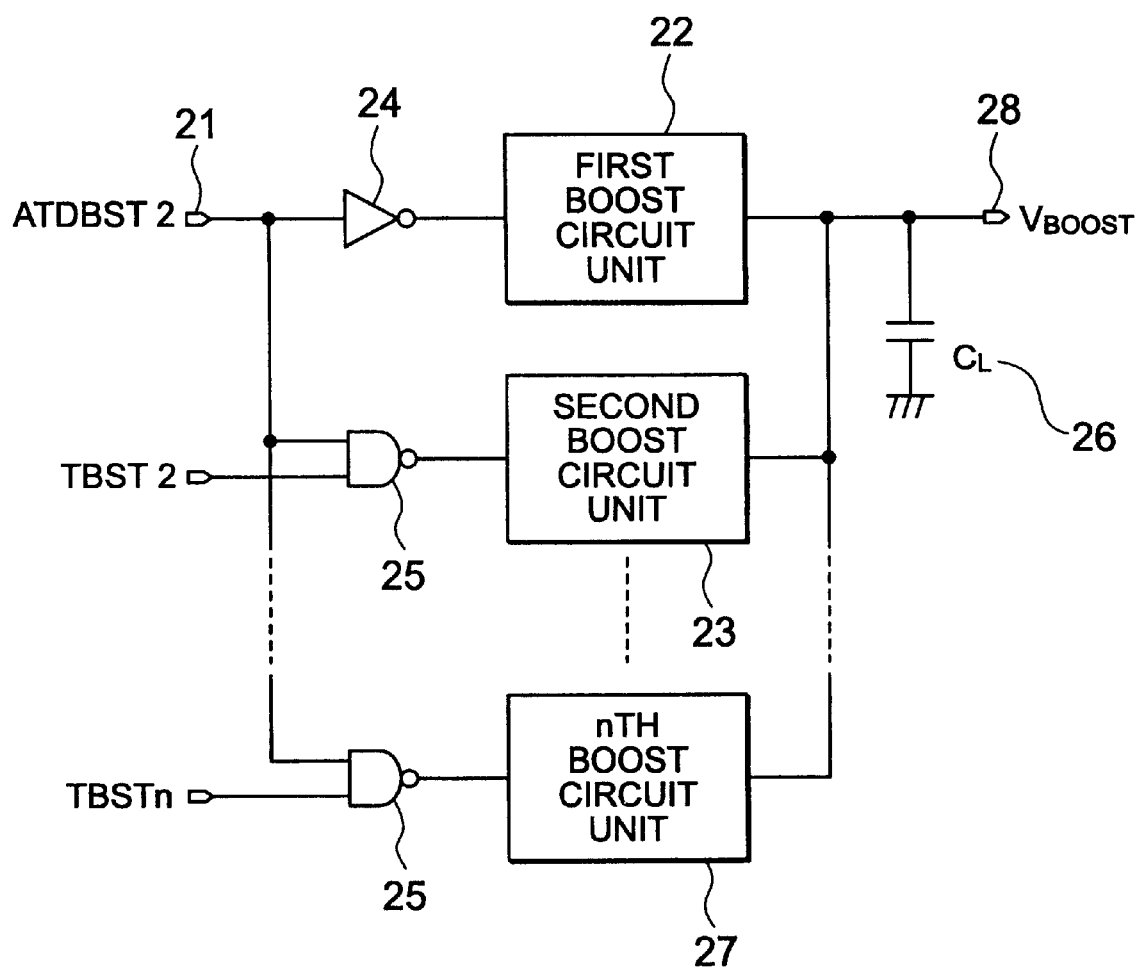
FIG. 6 is a block diagram showing a boost circuit main body formed by connecting n boost circuit units in parallel in a second embodiment of the present invention.
Figure 7:
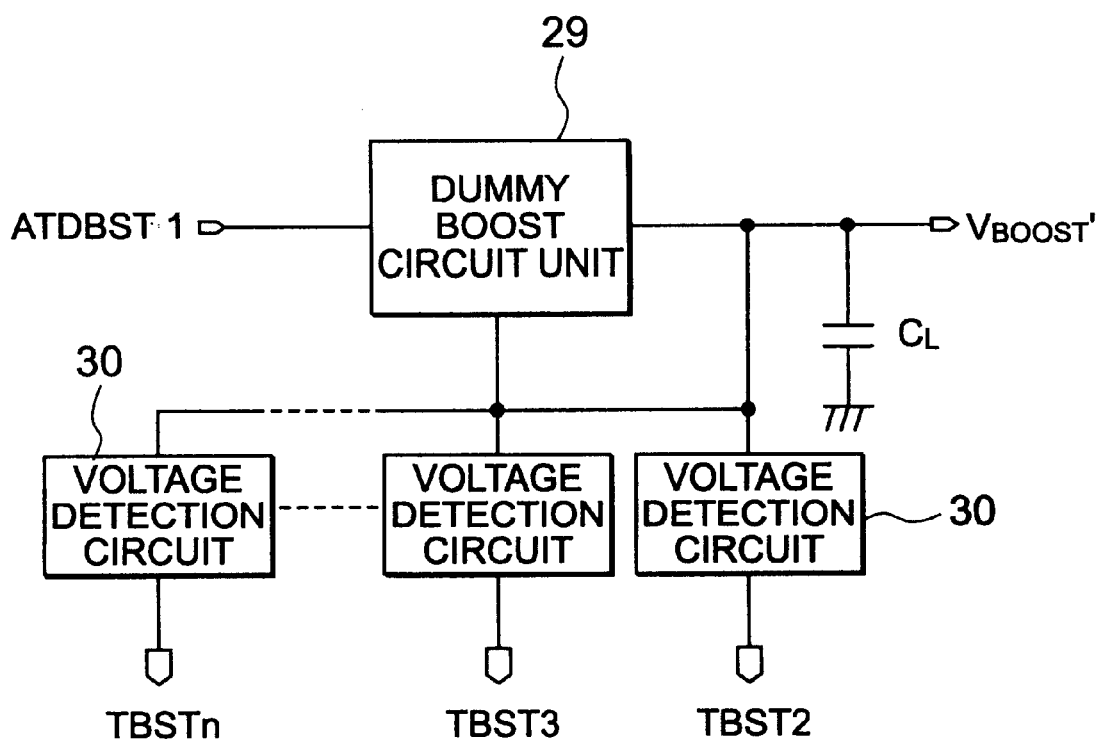
FIG. 7 is a block diagram showing a boost voltage detection unit in the second embodiment of the present invention.

A second embodiment of the present invention will now be described. FIG. 6 is a block diagram showing a main part of a boost circuit of the second embodiment. FIG. 7 is a block diagram showing a boost voltage detection unit. In a boost circuit of the present embodiment, a first boost circuit unit 22, a second boost circuit unit 23, ..., and an nth (where n is a natural number satisfying the relation n≧3) boost circuit unit 27 are connected in parallel between an input terminal 21 input with the boost input voltage ATDBST2 and an output terminal 28 for outputting the boost voltage. Between the input terminal 21 and the first boost circuit unit 22, an inverter 24 is connected. Between the input terminal 21 and each of the second to nth boost circuit units 23 to 27, a NAND circuit 25 is connected. The number of NAND circuits 25 are (n−1). To the other input terminals of NAND circuits 25, TBST2 to TBSTn are input from a voltage detection circuit 30 described later. Furthermore, between the output terminal 28 and the ground, a capacitor 26 having load capacitance ($C_L$) is connected.

On the other hand, in a boost voltage detection unit, a dummy boost circuit unit 29 having the same configuration as the first to nth boost circuit units 22 to 27 is provided as shown in FIG. 7. A boost input voltage ATDBST1 is input to the dummy boost circuit unit 29. The dummy boost circuit unit 29 amplifies this and outputs a dummy boost output voltage $V_{BOOST}'$. (n−1) of voltage detection circuits 30 are connected to the dummy boost circuit unit 29. The voltage detection circuit 30 detects the dummy boost output voltage $V_{BOOST}'$, compares the dummy boost output voltage $V_{BOOST}'$ with specific voltages $V_{LIMIT1}$ to $V_{LIMIT(n-1)}$, and outputs signals TBST2 to TBSTn each assuming the "high" or "low" state.

Figure 8:
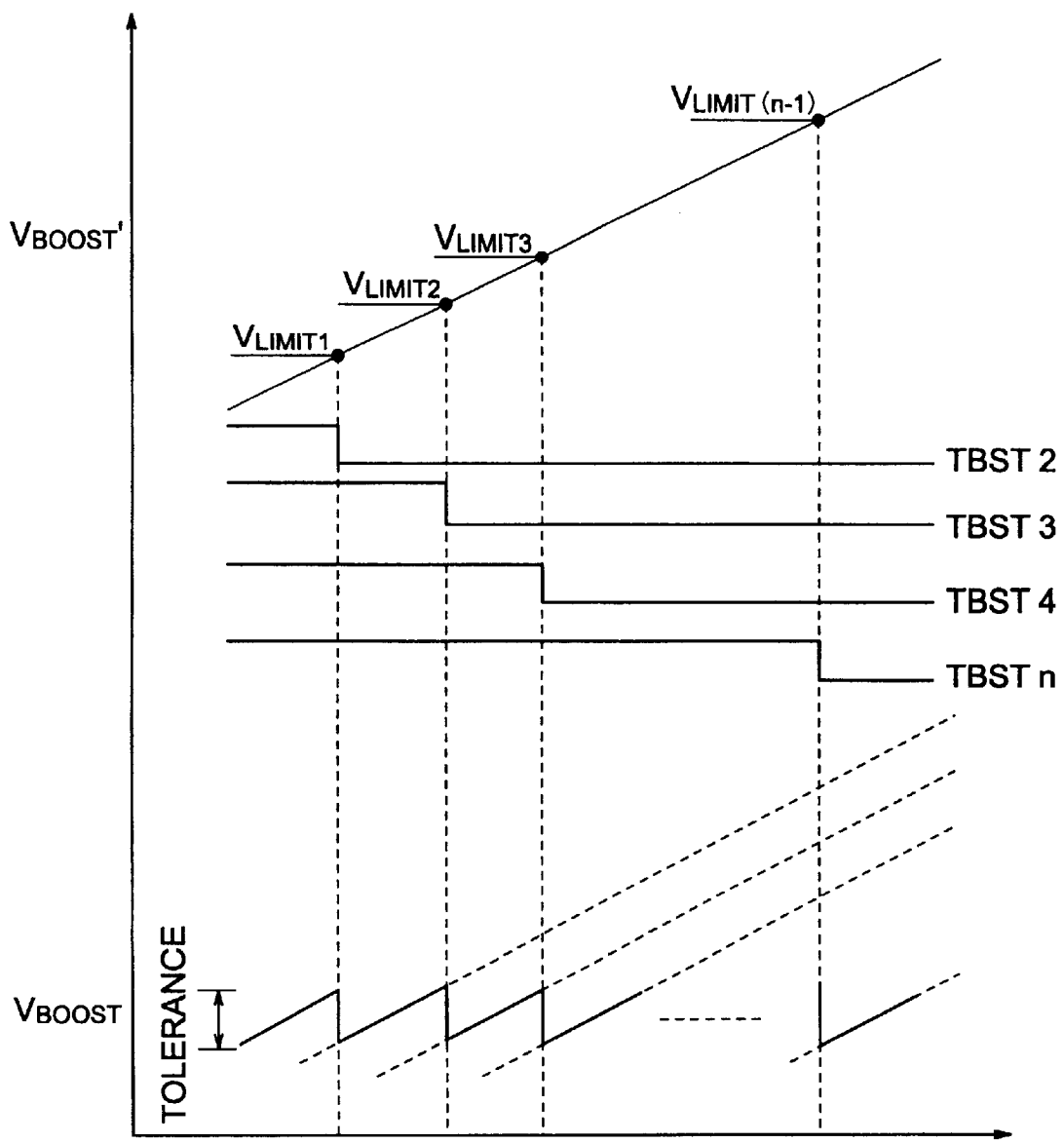
FIG. 8 is a diagram showing relations between variation factors of n boost circuit units, such as power supply voltage and external temperature, and boost output voltage in the second embodiment of the present invention.

As shown in FIG. 8, the lowest voltage $V_{LIMIT1}$ is set in a first voltage detection circuit 30, and the next lowest voltage $V_{LIMIT2}$ is set in a second voltage detection circuit 30. In this way, voltages which increase at equal intervals one after another are set. A highest voltage $V_{LIMIT(n-1)}$ is set in the last (n−1)th voltage detection circuit 30. These voltage detection circuits 30 detect the output voltage $V_{BOOST}'$ of the dummy boost circuit unit 29. If the output voltage $V_{BOOST}'$ is lower than $V_{LIMIT1}$, then all voltage detection circuits 30 output the signals TBST2 to TBSTn which are in the "high" states.

If $V_{BOOST}'$ becomes equal to or higher than $V_{LIMIT1}$ and lower than $V_{LIMIT2}$, then only the signal TBST2 of the first voltage detection circuit 30 becomes "low." If $V_{BOOST}'$ becomes equal to or higher than $V_{LIMIT2}$ and lower than $V_{LIMIT3}$, then only the signals TBST2 and TBST3 of the first and second voltage detection circuits 30 become "low." If $V_{BOOST}'$ becomes equal to or higher than $V_{LIMIT(n-1)}$, then the signals TBST2 to TBSTn which are in the "low" state are output from all voltage detection circuits 30, respectively.

Operation of the boost circuit of the second embodiment having the above-described configuration will now be described. First of all, if the boost input voltage ATDBST1 is input to the dummy boost circuit unit 29, then the dummy boost circuit unit 29 performs the boost operation and outputs the dummy boost voltage $V_{BOOST}'$. Each voltage detection circuit 30 detects the dummy boost voltage $V_{BOOST}'$. Each voltage detection circuit 30 outputs a "low" signal when the dummy boost voltage $V_{BOOST}'$ is higher than its set voltage. Each voltage detection circuit 30 outputs a "high" signal when the dummy boost voltage $V_{BOOST}'$ is lower than its set voltage.

As a result, "high" signals are output from as many voltage detection circuits as a number depending on the magnitude of the dummy boost voltage $V_{BOOST}'$. The boost circuit units 23 to 27 connected to the NAND circuits 25 input with the "high" signals perform the boost operation. In other words, if $V_{BOOST}'$ is equal to or higher than $V_{LIMIT(n-1)}$, then "low" signals are output from all voltage detection circuits 30. In this case, the input voltage ATDBST2 is not input to the second to nth boost circuit units 23, ..., 27 via the NAND circuits 25, and only the first boost circuit unit 22 is activated. On the other hand, if $V_{BOOST}'$ is lower than $V_{LIMIT1}$, then "high" signals are output from all voltage detection circuits 30. In this case, all NAND circuits 25 turn on, and all boost circuit units 22, 23, ..., 27 are activated.

In this way, a plurality of dummy boost circuits 22 to 27 are activated according to the magnitude of the dummy boost voltage $V_{BOOST}'$ as shown in FIG. 8. The output voltage $V_{BOOST}$ is output from the output terminal 28 of the boost circuit as represented by a solid line in FIG. 8. As a result, $V_{BOOST}$ is controlled to be within the tolerance of FIG. 8.

In the above-described embodiments, the boost circuit units used in the boost voltage detection section and the main part of the boost circuit have the same configuration. However, the present invention is not limited to this. For example, the value of the boost capacitance $C_{BOOST}$ of the boost circuit unit used in the boost voltage detection section may be made smaller than that of the boost circuit units used in the main part of the boost circuit. The boost voltage is determined by the power supply voltage, the boost capacitance $C_{BOOST}$, and the load capacitance $C_L$. Therefore, if the load capacitance $C_L$ of the boost voltage detection section can be made small, the boost capacitance $C_{BOOST}$ may be small. If the boost capacitance $C_{BOOST}$ can be made small, the area of the circuit of the boost voltage detection section can be made small.

In the present invention, the expression "the boost circuit units have the same configuration" refers not only the same physical configuration but also the above-described case.

What is claimed is:

1. A boost circuit comprising:
    a main part of the boost circuit having a plurality of (n) boost circuit units connected in parallel;
    a boost voltage detection section having a dummy boost circuit unit having same configuration as the boost circuit units of the main part of the boost circuit, and a voltage detection circuit for detecting an output voltage of only the dummy boost circuit unit; and
    a selection circuit for selecting a number of boost circuit units to be activated in the main part of the boost circuit, based on a result of detection of the boost voltage detection section.

2. A boost circuit according to claim 1, wherein the voltage detection circuit compares the output voltage of the dummy boost circuit unit with a specific voltage $V_{LIMIT}$ and outputs a "high" or "low" test signal.

3. A boost circuit comprising:
    a main part of the boost circuit having a plurality of (n) boost circuit units connected in parallel;
    a boost voltage detection section having a dummy boost circuit unit having same configuration as the boost circuit units of the main part of the boost circuit, and a voltage detection circuit for detecting an output voltage of the dummy boost circuit unit and comparing the output voltage of the dummy boost circuit unit with a specific voltage $V_{LIMIT}$ and outputting a "high" or "low" test signal; and a selection circuit for selecting a number of boost circuit units to be activated in the main part of the boost circuit, based on a result of detection of the boost voltage detection section, wherein the main part of the boost circuit comprises an input terminal for inputting a signal to the boost circuit units connected in parallel, and an output terminal for outputting a signal supplied from the boost circuit units connected in parallel, and wherein the selection circuit comprises an inverter connected between the input terminal and a first boost circuit unit, (n−1) NAND circuits respectively connected between the input terminal and second to nth boost circuit units, and a circuit for inputting the test signal to the NAND circuits.

4. A boost circuit according to claim 3, wherein the main part of the boost circuit has two boost circuit units connected in parallel, and the specific voltage $V_{LIMIT}$ is one in number.

5. A boost circuit according to claim 3, wherein the main part of the boost circuit has m (where m is a natural number of at least 3) boost circuit units connected in parallel, (m−1) values of the voltage $V_{LIMIT}$ are set, and (m−1) test signals depending on the (m−1) values of the voltage $V_{LIMIT}$ are input to (m−1) boost circuit units, respectively.

* * * * *